(12) United States Patent
Chen et al.

(10) Patent No.: US 10,943,802 B2
(45) Date of Patent: Mar. 9, 2021

(54) PHOTORESIST BOTTLE CONTAINER

(71) Applicant: Taiwan Semiconductor Manufacturing Co., Ltd., Hsinchu (TW)

(72) Inventors: Yu Kai Chen, Kaohsiung (TW); Chia-Hung Chung, Tainan County (TW); Ko-Bin Kao, Taichung (TW); Shi-Ming Wang, Tainan (TW); Su-Yu Yeh, Tainan (TW); Li-Jen Wu, Tainan (TW); Oliver Yu, Hsinchu (TW); Wen-Shiung Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 124 days.

(21) Appl. No.: 16/233,701

(22) Filed: Dec. 27, 2018

(65) Prior Publication Data
US 2020/0043762 A1 Feb. 6, 2020

Related U.S. Application Data

(60) Provisional application No. 62/712,426, filed on Jul. 31, 2018.

(51) Int. Cl.
*H01L 21/67* (2006.01)
*G03F 7/16* (2006.01)

(52) U.S. Cl.
CPC .......... *H01L 21/67253* (2013.01); *G03F 7/16* (2013.01); *H01L 21/6715* (2013.01); *F17C 2201/0109* (2013.01)

(58) Field of Classification Search
CPC ................... Y10T 137/7036; Y10T 137/7043
USPC ............................................ 220/23.87, 23.89
See application file for complete search history.

(56) References Cited

U.S. PATENT DOCUMENTS

| | | | | |
|---|---|---|---|---|
| 1,148,059 | A * | 7/1915 | Steel | A01J 9/00 220/569 |
| 4,793,491 | A * | 12/1988 | Wolf | B65D 85/84 206/509 |
| 4,802,515 | A * | 2/1989 | Pytryga | F17C 13/085 141/97 |
| 4,842,139 | A * | 6/1989 | Krieg | F17C 13/123 206/386 |
| 4,964,529 | A * | 10/1990 | Houston | F17C 13/084 206/523 |
| 5,044,514 | A * | 9/1991 | Portat | B65D 11/06 220/23.87 |
| 6,192,919 | B1 * | 2/2001 | Jackson | B67D 7/0272 137/315.01 |
| 6,257,360 | B1 * | 7/2001 | Wozniak | B60K 15/013 180/69.5 |
| 6,698,619 | B2 * | 3/2004 | Wertenberger | B65D 77/06 222/105 |

(Continued)

*Primary Examiner* — Robert K Arundale
(74) *Attorney, Agent, or Firm* — Sterne, Kessler, Goldstein & Fox P.L.L.C.

(57) ABSTRACT

The present disclosure describes a container for placing an object therein. The container includes a container body and a lid over the container body, a collision-preventing portion attached to one or more of the container body and the lid and configured to buffer an impact force, a pairing recognition mechanism configured to detect an object placed in the container body, and a liquid-detecting sensor configured to detect a leakage from the object.

20 Claims, 8 Drawing Sheets

(56) References Cited

U.S. PATENT DOCUMENTS

| | | | | |
|---|---|---|---|---|
| 6,990,391 B1* | 1/2006 | Cunha | ............ | A23G 9/045 |
| | | | | 222/52 |
| 2005/0006392 A1* | 1/2005 | Yuan | ............ | F17C 13/083 |
| | | | | 220/560.12 |
| 2017/0242340 A1* | 8/2017 | Jang | ............ | H01L 21/6719 |
| 2020/0016761 A1* | 1/2020 | Yu | ............ | B25J 15/0052 |
| 2020/0103756 A1* | 4/2020 | Chen | ............ | H01L 21/67294 |

\* cited by examiner

PHOTORESIST BOTTLE CONTAINER

CROSS-REFERENCE TO RELATED APPLICATIONS

This application claims the benefit of U.S. Provisional Patent Application No. 62/712,426, titled "Photoresist Bottle Container," filed Jul. 31, 2018, the disclosure of which is incorporated by reference in its entirety.

BACKGROUND

Photoresist (PR) is a crucial element in the semiconductor industry. PR is used in various stages of semiconductor fabrication process for forming patterns on wafers. PR bottles (e.g., bottles that contains PR for semiconductor fabrication usage) have been manually replaced for PR refill/replacement. However, manual replacement of PR bottles can be time-consuming and costly, and can be susceptible to human mistakes and damages.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor fabrication, PR is a crucial element for forming various patterns/features. PR is kept in bottles, which are distributed at different locations of a fabrication facility. A plastic cover/bag can be used to wrap over a PR bottle to prevent potential damages/spills of the PR. When in use, PR bottles are placed in containers that can hold the PR bottles at a suitable orientation (e.g., with the top of the bottle facing up) to prevent PR spill/leakage. When a PR bottle is empty or is low in PR, a technician can locate the PR bottle, e.g., based on a report, manually move the PR bottle to a certain location (e.g., a warehouse for placing empty PR bottles), and manually refill the PR. The replacement of the PR bottle can be recorded/verified by scanning a bar code assigned to the PR bottle. However, during the replacement and transport of the PR bottle, little or no protection is provided to the PR bottle from collision and/or inappropriate human operations, and the PR bottle can be susceptible to damages or PR spill. The scanning of the bar code can also require attention of the technician and human error (e.g., misplacement of incorrect PR bottle) can be hard to detect. The replacement and transport of PR bottles can thus require an undesirable amount of time and labor, and can be costly. Further, when damages and/or spill occur, it can be difficult to detect the location and time of the damages/spill.

Embodiments of the present disclosure describe an apparatus and a system for monitoring PR leakage. The PR bottle container (or "container" for ease of description) can hold a PR bottle at an appropriate orientation and prevent potential collision of the PR bottle and PR leakage. The container can provide protection to the PR bottle during usage and transport. The container can enable automated replacement, transport, and recording of the PR bottle. The container can also allow PR leakage to be detected and bi-directional communication with a central controller regarding the status of the container. When PR leakage occurs, the container can communicate with the central controller and/or other devices and transmit detailed information (e.g., the identification (ID) number of the PR bottle/container, location, and time) of the spill/leakage. Thus, PR spill/leakage can be easier to detect.

With the protection of the container, the PR bottle is less susceptible to collision with the sidewalls and other parts of the container. Thus, the PR bottle is less susceptible to PR spill/leakage. Further, the container can verify the correct PR bottle is placed into the container by a suitable pairing recognition means (e.g., radio frequency identification method, Bluetooth method, etc.) so that the PR bottle replacement/refill is less susceptible to human error. The container can further include upper and lower collision-preventing portions that can prevent the PR bottle from being placed at an orientation away from the vertical direction, and a sway-preventing portion that prevents the PR bottle from bouncing and moving in the container. By using the disclosed container and method, PR bottles are less susceptible to damage and PR spill/leakage. The transport and replacement of PR bottles can be less time-consuming and less costly.

Figure 1A:
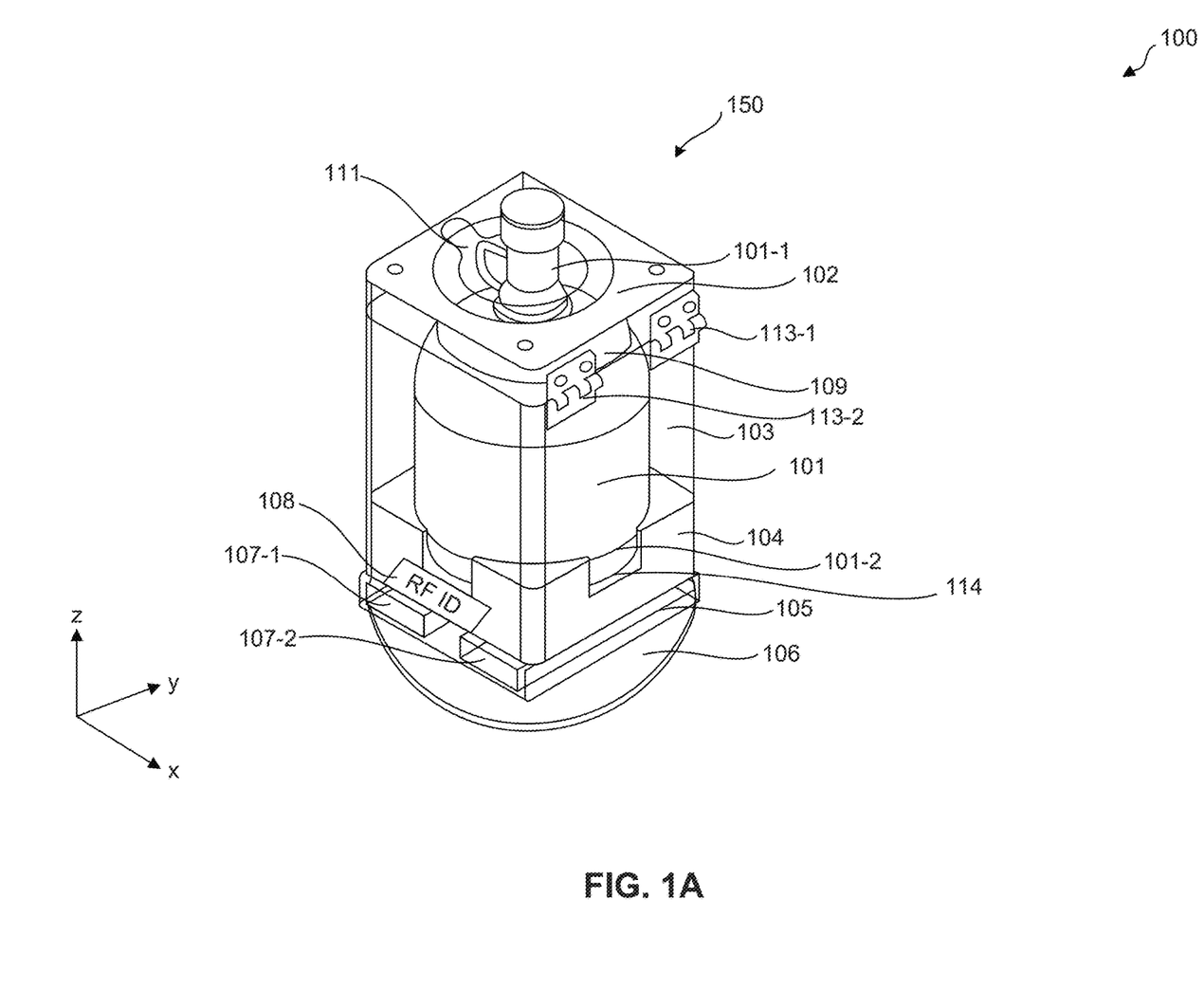
FIGS. 1A-1C illustrate different views of an exemplary PR container, according to some embodiments.
Figure 1B:
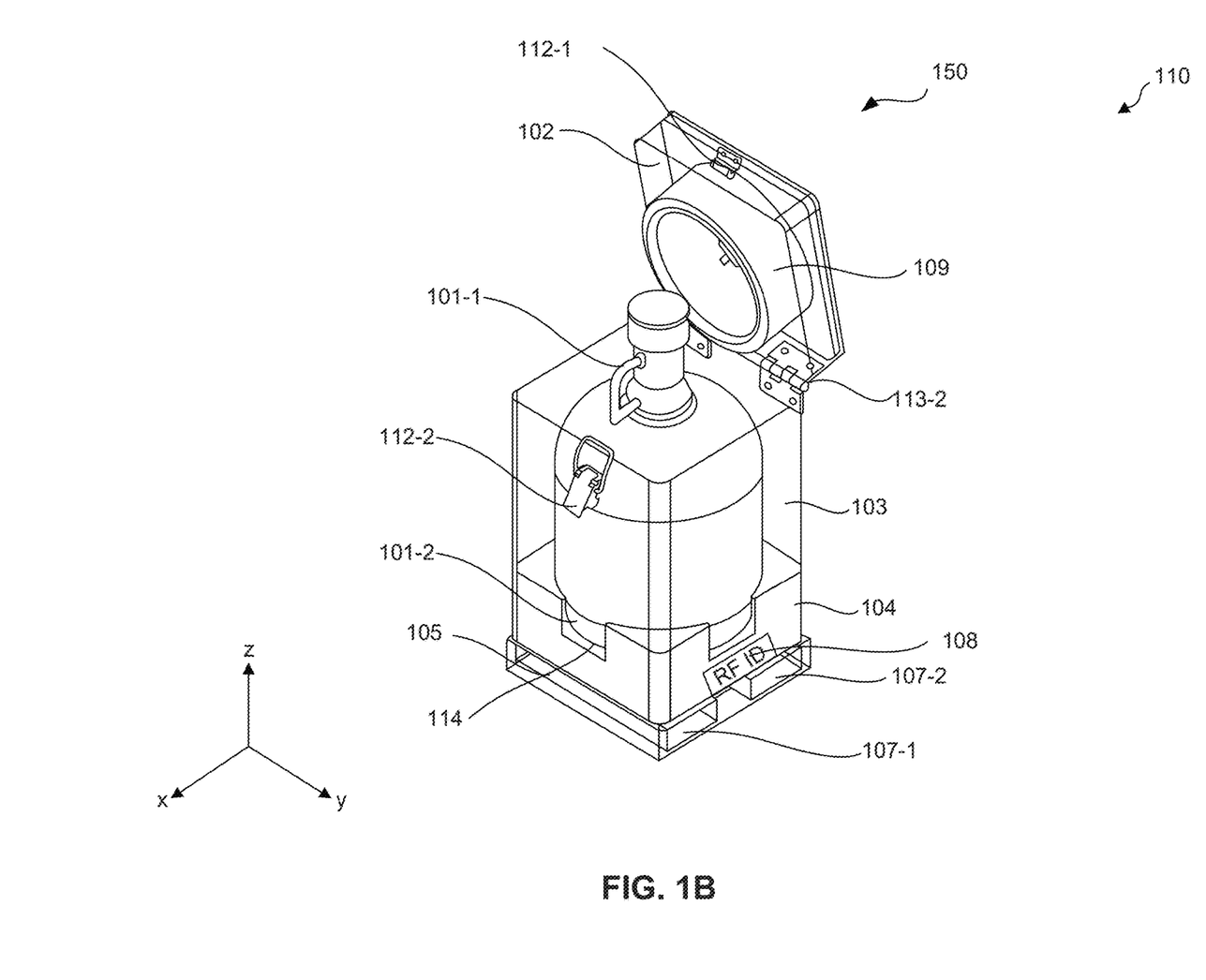
Figure 1C:
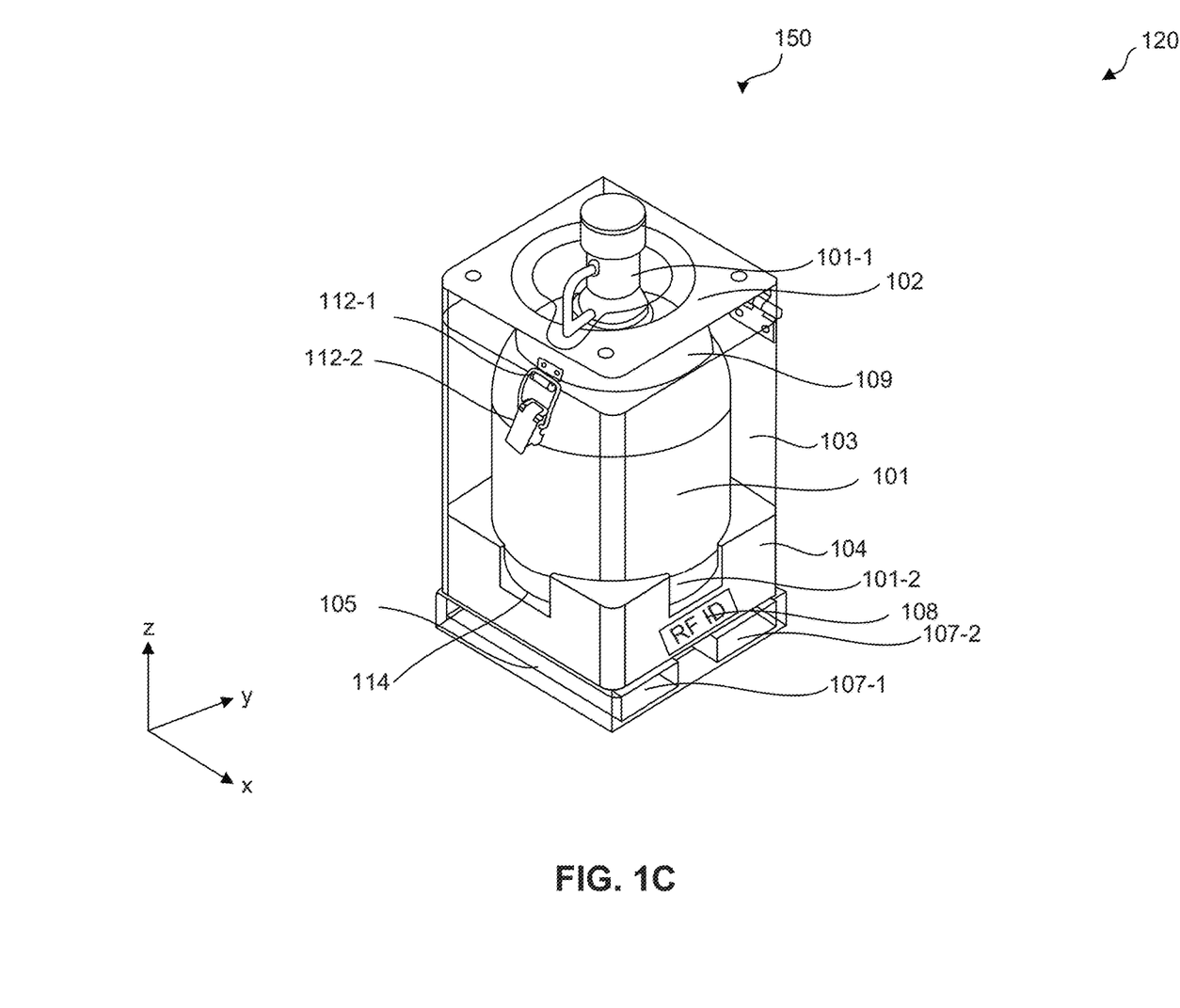

FIGS. 1A and 1B illustrate different views 100 and 110 of an exemplary container with the lid closed from different viewing angles, and FIG. 1C illustrates view 120 of the exemplary container with the lid open, according to some embodiments. As shown in FIGS. 1A-1C, container 150 can include a lid 102, a container body 103, a lower collision-preventing portion 104, a carrier insertion portion 105, a portion of a pairing recognition means 108, an upper collision-preventing portion 109, and a sway-preventing portion 112. Lid 102 can include an opening 111 for exposing the top of a PR bottle. Lid 102 can be jointly connected to container body 103 through any suitable means 113 that allow lid 102 to open and close. For illustrative purposes, a pair of hinges 113-1 and 113-2 are shown as an example. Carrier insertion portion 105 can include a plurality of insertion openings for a suitable supporting structure (e.g., robotic arm) to insert into and carry container 150 onto a carrier (e.g., a vehicle) for PR bottle refill/replacement. For illustrative purposes, two insertion openings 107-1 and 107-2 are shown. When a PR bottle 101 is placed in container 150 and lid 102 is closed, bottle top 101-1 can fit in and be exposed by opening 111, and bottle bottom 101-2 can fit in lower collision-preventing portion 104 and rest thereon. Sway-preventing portion 112 can fix/limit the movement between lid 102 and container body 103, and upper collision-preventing portion 109 and lower collision-preventing portion 104 can contact PR bottle 101 and keep PR bottle 101 facing upward (e.g. upwardly straight). PR bottle 101 can thus have limited or no movement in container 150. Details of container 150 are described below.

Lid 102 can include any suitable material that has sufficient stiffness and strength for holding and protecting PR bottle 101. For example, lid 02 can be formed from materials that include one or more of reinforced plastic and metal. In some embodiments, lid 102 includes stainless steel. Lid 102 can include opening 111 for exposing the bottle top 101-1. The exposed bottle top 101-1 can allow other applications to be operated on PR bottle 101. For example, lid 102 can expose the cap (e.g., at the very top of bottle top 101-1) of PR bottle 101 to allow an automated robotic arm to turn and open the cap when lid 102 is closed. PR bottle 101 can be kept at a stable position/orientation when lid 102 is closed, so PR bottle 101 is less susceptible to spill. By jointly connected to container body 103, lid 102 can flip down to close container 150 or flip up to open container 150.

Container body 103 can include any suitable material that has sufficient stiffness and strength for holding and protecting PR bottle 101 and other parts in container 150. Container body 103 can be made of the same material as or a different material from lid 102. In some embodiments, container body 103 includes reinforced plastic for its light weight. Container body 103 can have any suitable shape that can contain PR bottle 101. For example, the horizontal cross-section of container body 103 (e.g., along the x-y plane) can have a squared shape, a circular shape, a rectangular shape, and/or an irregular shape. The horizontal cross-section of container body 103 can have greater dimensions than PR bottle 101 to allow PR bottle 101 to be fully placed within container body 103. In some embodiments, lid 102 has a same shape and dimensions as the horizontal cross-section of container body 103. In some embodiments, the horizontal cross-section of container body 103 has a squared shape.

Upper collision-preventing portion 109 can be fixed onto lid 102, and lower collision-preventing portion 104 can be placed onto container bottom of container 150 (e.g., the bottom of container body 103). Upper collision-preventing portion 109 and lower collision-preventing portion 104 can include any suitable materials that have desirable stiffness and can provide support and cushion of PR bottle 101. The materials that form upper collision-preventing portion 109 and lower collision-preventing portion 104 should have desirable stiffness and softness to provide support of container 150 and buffer any movement/impact of PR bottle 101. For example, they can include shock-absorbing materials such as various types of rubber, e.g., nitrile rubber, polypropylene rubber, and/or poly vinyl chloride. In some embodiments, upper collision-preventing portion 109 and lower collision-preventing portion 104 can include nitrile rubber.

Upper collision-preventing portion 109 and lower collision-preventing portion 104 can have any suitable shapes that can maintain the position and orientation of PR bottle 101. For example, upper collision-preventing portion 109 can be fixed onto the inner side of lid 102 (e.g., the side that faces the inside of container 150) by any suitable means (e.g., adhesion and/or bonding) and have a horizontal cross-section smaller than the horizontal cross-section of lid 102. In some embodiments, the horizontal cross-section of upper collision-preventing portion 109 has a circular shape and matches the surface periphery of PR bottle 101 so that upper collision-preventing portion 109 can contact and buffer PR bottle 101 along the vertical direction (e.g., the z-axis) and any horizontal direction (e.g., in the x-y plane). When lid 102 flips down to close container 150, upper collision-preventing portion 109 can contact PR bottle 101 and buffer the movement of PR bottle 101 such that PR bottle 101 can maintain facing upwardly with improved stability.

Meanwhile, lower collision-preventing portion 104 can be fixed onto the container bottom when PR bottle 101 is placed in container 150 and contacts lower collision-preventing portion 104. The outer periphery of lower collision-preventing portion 104 can be similar or match the inner periphery of container body 103 so that lower collision-preventing portion 104 can securely fit into container body 103. The movement of lower collision-preventing portion 104 can thus be reduced/prevented. In some embodiments, lower collision-preventing portion 104 includes a recessed portion 114 that allows bottle bottom 101-2 to fit in so that the position and orientation of PR bottle 101 can be further maintained. Recessed portion 114 can substantially be at the center of lower collision-preventing portion 104 and can have a same shape and dimensions as bottle bottom 101-2. When PR bottle 101 is placed over lower collision-preventing portion 104, bottle bottom 101-2 can securely fit in and rest in recessed portion 114. The shape and dimensions of recessed portion 114 can limit the movement of PR bottle 101 vertically (e.g., along the z-axis) and horizontally (e.g., along the x-y plane). In some embodiments, the horizontal cross-section of bottle bottom 101-2 has a circular shape, and horizontal cross-section of the recessed portion 114 has a circular shape of substantially the same dimensions. When PR bottle 101 is placed over recessed portion 114, lower collision-preventing portion 104 can contact and buffer PR bottle 101 along the vertical direction (e.g., the z-axis) and any horizontal direction (e.g., in the x-y plane).

Thus, using upper collision-preventing portion 109 and lower collision-preventing portion 104, movement of PR bottle 101 in different directions can be reduced. PR bottle 101 can be supported from various directions (e.g., horizontally and vertically), and impact/shock by PR bottle 101, along any direction, can be absorbed or buffered by the contacting upper collision-preventing portion 109 and/or lower collision-preventing portion 104. PR bottle 101 can be maintained at a suitable position and orientation (e.g., facing upwardly straight) with improved stability. PR bottle 101 can thus be less susceptible to colliding with other parts of container 150.

Sway-preventing portion 112 can prevent PR bottle 101 from moving and gliding/bouncing (e.g., caused by the reaction force from lower collision-preventing portion 104) after being placed in container 150. Sway-preventing portion 112 can fix the relative movement between lid 102 and container body 103 so that the movement of top portion of PR bottle 101 can be limited to opening 111, and the vertical movement of PR bottle 101 can be limited/prevented by upper collision-preventing portion 109 and lower collision-preventing portion 104. Thus, PR bottle 101 can be prevented from swaying after being placed in container 150. Sway-preventing portion 112 can include any device and/or structure that can limit the movement of PR bottle 101. In an example, sway-preventing portion 112 can be a toggle latch. When PR bottle 101 is placed in container 150 and lid 102 flips down on container body 103, first portion 112-1 and second portion 112-2 of toggle latch can close to lock the relative movement between lid 102 and container body 103 so that lid 102 and container body 103 can be relative static to one another. Accordingly, movement of PR bottle 101 can be reduced/eliminated. In some embodiments, sway-preventing portion 112 can sustain a desirably amount of pulling force so that sway-preventing portion 112 can keep lid 102 relatively static to container body 103 under reaction force from PR bottle 101. PR bottle 101 can thus be cross-supported by container 150 through upper collision-preventing portion 109 and lower collision-preventing portion 104 with improved stability, and the movement of PR bottle 101 can be further limited.

Container 150 and PR bottle 101 can together include a pairing recognition means. The pairing recognition means can include any suitable wireless recognition methods that can exclusively and automatically pair container 150 with PR bottle 101. For example, the pairing recognition means can include an RFID tag and reader and/or a Bluetooth transmitter and reader. In some embodiments, container 150 and PR bottle 101 each includes a different one of an RFID tag and reader. For illustrative purposes, an RFID tag is labeled on container 150. For example, container 150 can include an RFID reader and PR bottle 101 can include an RFID tag. For illustrative purposes, a portion of the pairing recognition means, is shown as an RFID reader 108 on container 150. The other portion of the pairing recognition means, an RFID tag can be on PR bottle 101 and is not shown. RFID reader 108 and the tag can be placed at any suitable place of container 150 and PR bottle 101, respectively. RFID reader 108 can communicate with a central controller of the fabrication facility through a wireless network to provide updated status of PR bottle 101. RFID reader 108 can be programmed to exclusively identify PR bottle 101 through the RFID tag. In some embodiments, when another PR bottle (e.g., a PR bottle that has a RFID tag mismatch to RFID reader 108) is mistakenly placed in container 150, an error message can be sent to a central controller and a notification can be sent to receiving devices of one or more technicians (e.g., the technicians responsible for PR bottle replacement) to inform the mistaken PR bottle replacement. The error message and/or the notification can also include the ID of the container/PR bottle, the time, and the location of the replacement. In some embodiments, container 150 includes an indicator light (not shown) attached at a suitable position (e.g., the sidewall of container body 103 or lid 102). The indicator light can communicate with container 150 through wired and/or wireless means. In some embodiments, when a mistaken PR bottle is placed in container 150, indicator light emits a warning signal (e.g., red flashing light); and when PR bottle 101 is placed in container 150, the indicator light emits a different signal (e.g., green light). Thus, container 150 can automatically identify the pairing PR bottle 101 and send out notifications when a wrong PR bottle is placed within container 150. The replacement of PR bottle using container 150 can thus be less susceptible to error and is less time-consuming.

Carrier insertion portion 105 can include a plurality of insertion openings 107 that can allow suitable supporting structures to insert in and lift container 150 as one piece. PR bottle 101 can then be moved together with container 150, e.g., for replacement/refill, and container 150 can protect and support PR bottle 101 during transport. Suitable supporting structures can be of any shape to fit in insertion openings 107 and can include any structure of sufficient stiffness to sustain the weight of container 150 and PR bottle 101 filled with PR. Carrier insertion portion 105 can include any suitable number of insertion openings 107. For illustrative purposes, two insertion openings 107-1 and 107-2 are shown. The supporting structures can be operated manually or automatically. In some embodiments, the supporting structures can include automated robotic arms/prongs that are part of a transport vehicle. The robotic arms/prongs can insert into insertion openings 107-1 and 107-2, lift container 150, and move container 150 onto the transport vehicle. In some embodiments, a vertical cross-section (e.g., cross-section along the x-z plane) of an insertion opening 107 is rectangular, and the insertion opening has sufficient horizontal length (e.g., length along the y-axis) to allow container 150 to be picked up smoothly and with stability. In some embodiments, insertion openings 107 are through holes along the y-axis. Carrier insertion portion 105 can include any suitable materials that have sufficient stiffness and strength. In some embodiments, carrier insertion portion 105 includes metals and/or alloys (e.g., stainless steel). Carrier insertion portion 105 can be manufactured separately from container body 103 and can be bonded onto container body 103 after its formation. Carrier insertion portion 105 can be firmly attached to container body 103 at the bottom through any suitable means, such as adhesion/bonding and/or nailing.

In some embodiments, container 150 includes a bottom stage 106 under and firmly fixed to carrier insertion portion 105. Bottom stage 106 can include a sufficiently flat bottom surface to allow container 150 to maintain its orientation stably along the vertical direction (e.g., z-direction). Bottom stage 106 can also buffer the impact when container 150 is placed on a surface. Bottom stage 106 can have a larger horizontal area (e.g., along the x-y plane) than carrier insertion portion 105 so that container 150 can be placed on a horizontal surface with improved stability. Bottom stage 106 can have any suitable shape along the x-y plane. In some embodiments, bottom stage 106 has a circular shape and carrier insertion portion 105/container 150 is fixed at the center of bottom stage 106. Bottom stage 106 can include any suitable materials that have sufficient stiffness and strength to support container 150 and PR bottle 101. In some embodiments, bottom stage 106 can include metals and/or alloys (e.g., stainless steel).

Figure 2A:
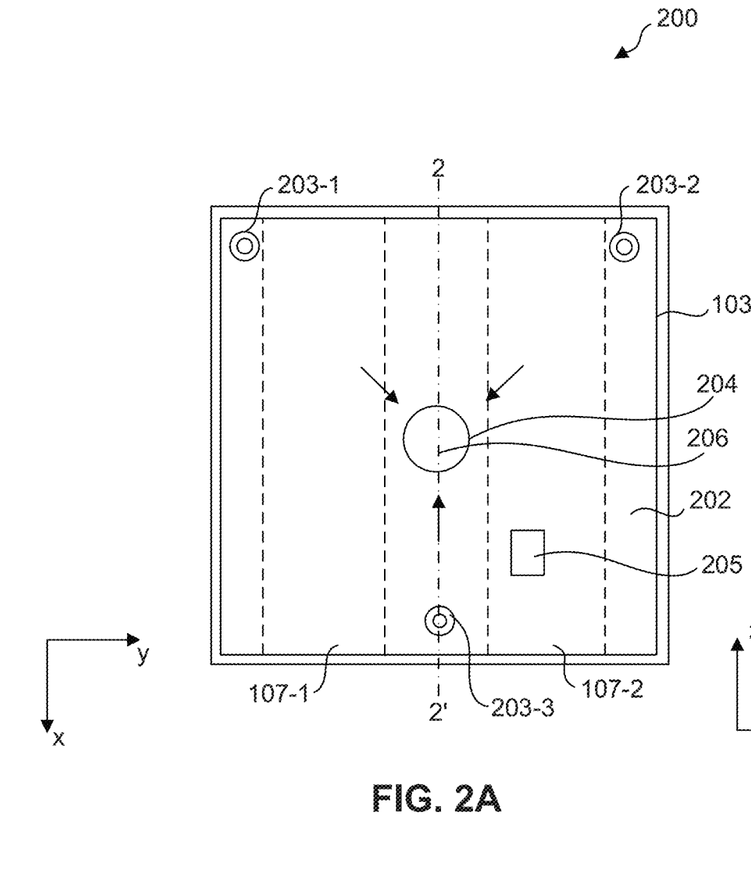
FIGS. 2A-2B illustrate a top view and a cross-sectional view of an exemplary container bottom, according to some embodiments.
Figure 2B:
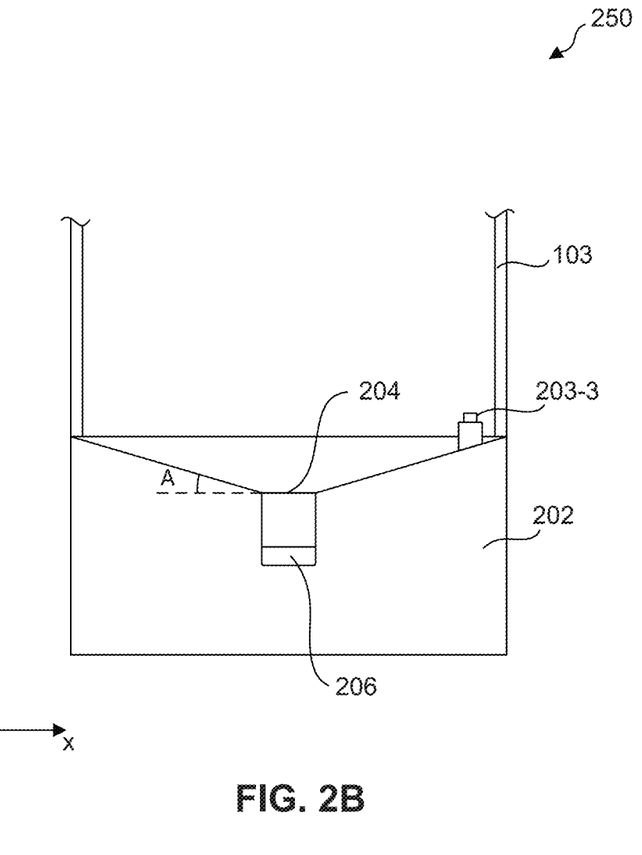

FIG. 2A illustrates a top view 200 of an exemplary container bottom (e.g., the bottom of container 150), and FIG. 2B illustrates a cross-sectional view 250 of the exemplary container bottom along 2-2' direction, according to some embodiments. FIGS. 2A and 2B illustrate the structure and components of container bottom without the lower collision-preventing portion. As shown in FIGS. 2A and 2B, container bottom can be surrounded by container body 103. The container bottom can include a plurality of position lock-in pins 203 for fixing the position of the lower collision-preventing portion when a PR bottle is placed over the lower collision-preventing portion. The plurality of position lock-in pins 203 can support the lower collision-preventing portion and the PR bottle from the backside of the lower collision-preventing portion. To improve the stability of the PR bottle, the number of the position lock-in pins 203 can be at least 3 and position lock-in pins 203 can be distributed symmetrically about the center of the container bottom (or the center of PR bottle 101, or the center of the pattern formed by the lock-in pins 203). For illustrative purposes, three position lock-in pins (e.g., 203-1, 203-2, and 203-3) are shown. Container bottom can also include a leakage-detecting mechanism which includes a liquid-collecting hole 204 and a liquid-detecting sensor 206 positioned at the bottom of liquid-collecting hole 204. When a spill occurs, the spilled PR can flow into liquid-collecting hole 204 and be detected by liquid-detecting sensor 206. Liquid-collecting hole 204 can have any suitable cross-section along the horizontal plane (e.g., the x-y plane). In some embodiments, liquid-collecting hole 204 can have a circular cross-section. The container bottom can further include an integrated circuit (IC) 205, with suitable software and hardware, for facilitating the communication among different parts of the container and between the container and the central controller. IC 205 can be embedded in the container bottom and can receive the detection result from liquid-detecting sensor 206. IC 205 can also include a portion of the pairing recognition portion (e.g., RFID reader/tag) for verifying the correct PR bottle. The container bottom can include any suitable material with sufficient stiffness and strength and corrosion resistance. In some embodiments, the container bottom includes stainless steel. Carrier insertion openings 107-1 and 107-2, hollow and marked in dashed lines, can be formed under the top surface of container bottom. Portions of the container bottom filled with the material are labeled as element 202.

As shown in FIG. 2B, the top surface of the container bottom can have a slope A with respect to a horizontal plane (e.g., in the x-direction). The top surface of container bottom can descend from the boundary towards the center and can form a "V" shape, with liquid-collecting hole 204 at the center. The top surfaces of the position lock-in pins can be in a same horizontal plane. Position lock-in pins (e.g., 203-3) can provide support when a PR bottle is placed thereon so that the bottom of the PR bottle can rest horizontally. In some embodiments, the slope that forms the "V" shape can be at an angle A (e.g., in a range between about 5 degrees and about 45 degrees). Angle A can be an optimized angle to allow the spilled/leaked PR to timely flow into liquid-collecting hole 204 to be detected. Angle A should also be sufficiently sized so the container bottle can have a compact shape (or height along the z axis). In some embodiments, angle A is about 20 degrees. The slope can allow spilled or leaked liquid to flow into liquid-collecting hole 204 more easily, and thus can allow the detection of spill/leakage more easily. In some embodiments, position lock-in pins can be distributed on a surface that descends from the boundary of the bottom portion of the PR bottle towards the center of the bottom portion of the PR bottle. In some embodiments, position lock-in pins can be distributed symmetrically about the center of the bottom portion of the PR bottle. Arrows in FIG. 2A indicate the directions that the liquid flows over the top surface of container bottom.

Liquid-detecting sensor 206 can communicate with IC 205 through wired/wireless communication means when a spill/leakage is detected. IC 205 can accordingly send a notification to the central controller and/or turn on an indicator light of container. In some embodiments, IC 205 includes a clock (or timer) and is programmed to include a map of the facility/surroundings. The notification can include the time and location of the spill/leakage. When receiving the spill/leakage notification, the central controller can send notifications (e.g., to technicians responsible for monitoring PR bottle replacement) via communication devices. The notifications can include the time and location of the leakage/spill. Thus, a liquid leakage/spill in the container can be addressed more efficiently.

Figure 3A:
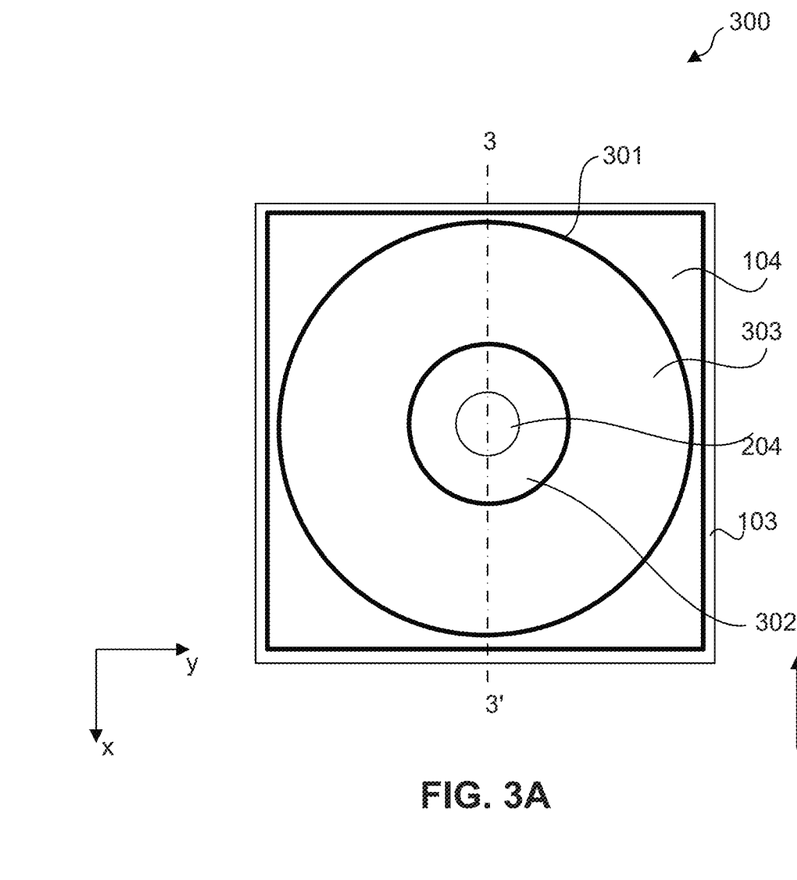
FIGS. 3A-3B illustrate a top view and a cross-sectional view of an exemplary lower collision-preventing portion, according to some embodiments.
Figure 3B:
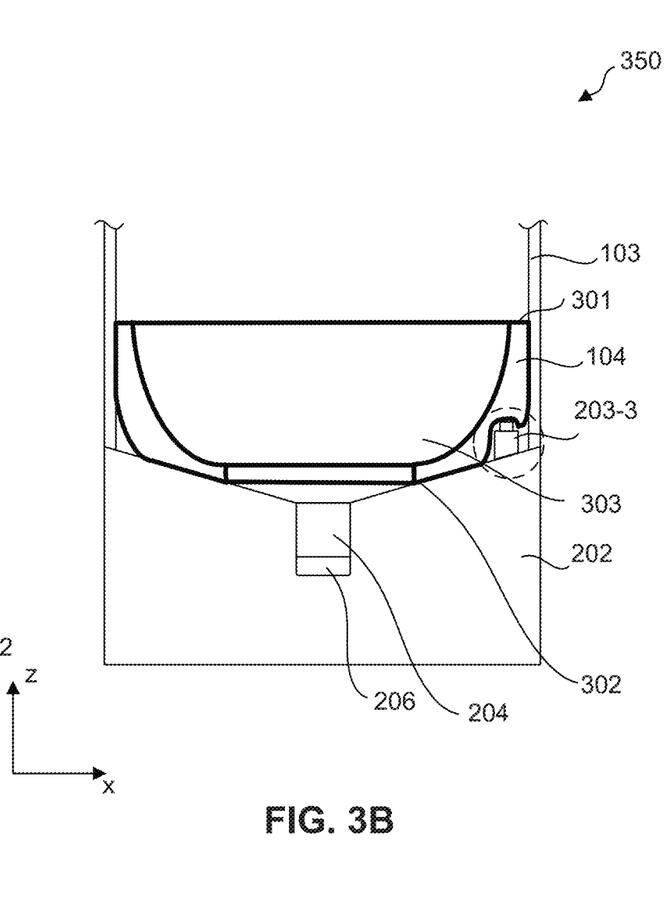

FIG. 3A illustrates a top view 300 of an exemplary lower collision-preventing portion over the container bottom, and FIG. 3B illustrates a cross-sectional view 350 of the exemplary lower collision-preventing portion over the container bottom along the 3-3' direction, according to some embodiments. For illustrative purposes, the bold lines depicts the outlines of lower collision-preventing portion 104. As shown in FIGS. 3A and 3B, in some embodiments, lower collision-preventing portion 104 is placed over the top surface of the container bottom and is surrounded by container body 103. A PR bottle (not shown) can be placed in the container and a periphery 301 of recessed portion 303 can surround the body of the PR bottle. Recessed portion 303 can be the same as or similar to recessed portion 114 illustrated in FIGS. 1A-1C. In some embodiments, the PR bottle has a circular cross-section along the x-y plane, and periphery 301 has a circular shape that substantially matches the dimensions of the PR bottle. In some embodiments, lower collision-preventing portion 104 includes an opening 302 at the bottom of recessed portion 303. Opening 302 can expose liquid-collecting hole 204 so that a leakage/spill can flow through recessed portion 303 and be collected in liquid-collecting hole 204. Opening 302 can be of any suitable shape along the x-y plane. In some embodiments, opening 302 has a circular shape.

In some embodiments, lower collision-preventing portion 104 is fixed by the plurality of position lock-in pins (e.g., 203-3), as circled in FIG. 3B. The position of lower collision-preventing portion 104 can be fixed horizontally and/or vertically. The limited movement of lower collision-preventing portion 104 can allow the PR bottle to be placed at a desired orientation (e.g., along the vertical direction) with little or no horizontal movement. Further, reaction forces applied to the PR bottle, by lower collision-preventing portion 104, can be distributed more uniformly so that the PR bottle can remain its position and orientation with improved stability.

Figure 4A:
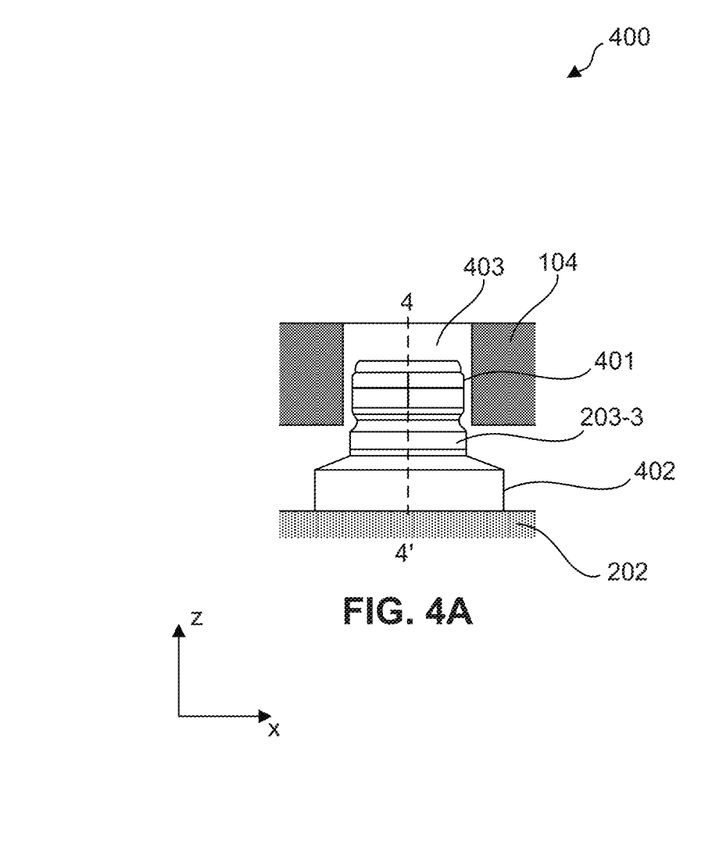
FIGS. 4A-4B illustrate cross-sectional views of an exemplary position lock-in pin, according to some embodiments.
Figure 4B:
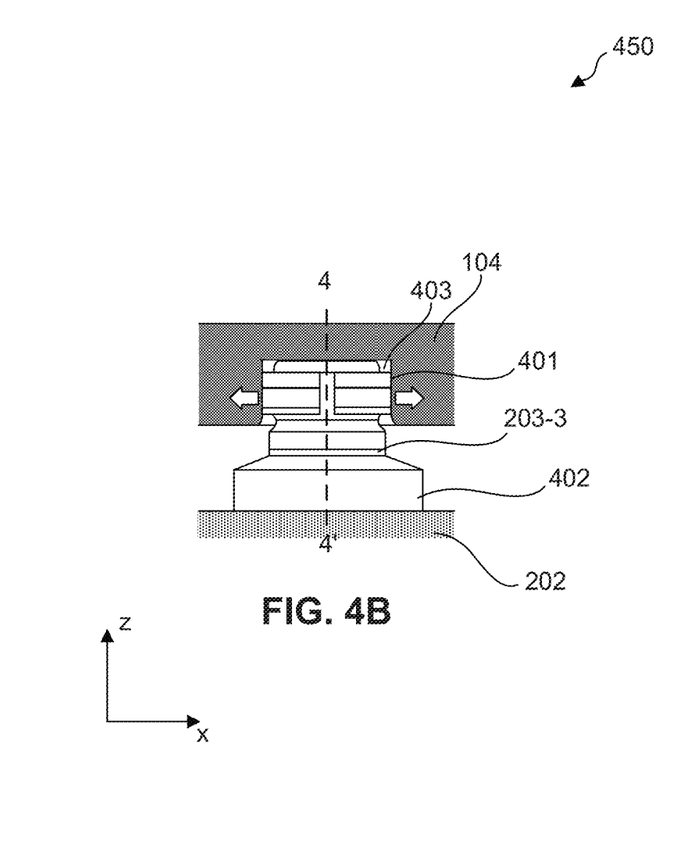

FIGS. 4A and 4B illustrate enlarged cross-sectional views 400 and 450 of position lock-in pin 203-3 illustrated in FIG. 3B, according to some embodiments. Position lock-in pin 203-3 can include any suitable device/mechanism that expands horizontally (e.g., along the x axis) when a pressure is applied (e.g., along the z axis) on the top of position lock-in pin 203-3. For example, position lock-in pin 203-3 can include a pressure sensor at the top of lock-in pin 203-3 to sense the pressure, and an elastic structure (e.g., a spring) under the pressure sensor to expand along the x axis or along the x-y plane when a pressure is detected (the y axis is perpendicular to the x-z plane). In some embodiments, position lock-in pin 203-3 includes a pin body 402 and a pin cap 401 over pin body 402. Position lock-in pin 203-3 can be fixed over or partially in the top surface of the container bottom. Lower collision-preventing portion 104 can include a recessed/dented portion 403 that covers at least pin cap 401.

In FIG. 4A, position lock-in pin 203-3 is not subjected to pressure along the vertical direction (e.g., pressure along the z-axis formed by placement of a PR bottle over lower collision-preventing portion 104), and lower collision-preventing portion 104 has little or no contact with pin cap 401. In FIG. 4B, position lock-in pin 203-3 is subjected to pressure along the vertical direction when a PR bottle is placed over lower collision-preventing portion 104, and lower collision-preventing portion 104 contacts the pin cap 401. As shown in FIGS. 4A and 4B, when sensing pressure is applied to pin cap 401 downwardly, pin cap 401 can automatically expand horizontally (indicated by the arrows in FIG. 4B) to contact the inner sidewall of dented portion 403. In some embodiments, pin cap 401 applies horizontal forces along various directions of the inner sidewall of dented portion 403 so that the friction between pin cap 401 and the inner sidewall reduce/eliminates the relative movement between lower collision-preventing portion 104 and position lock-in pin 203-3 (similar for other position lock-in pins). This action can be referred to as a "position lock-in" process. Accordingly, lower collision-preventing portion 104 can be fixed onto the position lock-in pins, and thus more firmly placed in the container. Lower collision-preventing portion 104 can provide more uniform and stable support to the PR bottle surrounded and supported by lower collision-preventing portion 104. As a result, a stable position and orientation of the PR bottle can be maintained.

Pin cap 401 can be any suitable shape and can include any suitable material of sufficient stiffness and strength to support lower collision-preventing portion 104 and the PR bottle (e.g., with or without PR contained within). For example, pin cap 401 and pin body 402 include metal and/or alloy. In some embodiments, pin cap 401 and pin body 402 include stainless steel. In some embodiments, to allow force and/or friction between pin cap 401 and dented portion 403 to be more uniformly, both pin cap 401 and dented portion 403 have a symmetric shape about central line 4-4' of pin cap 401. In some embodiments, both pin cap 401 and dented portion 403 have a circular shape along the horizontal plane (e.g., the x-y plane). The dimensions of dented portion 403 can be properly designed to allow pin cap 401, after the horizontal expansion, to contact and apply pressure over the inner sidewall of dented portion 403.

Position lock-in pins can lock the position of lower collision-preventing portion 104 when pressure (e.g., by the PR bottled placed thereon) is applied and release lower collision-preventing portion 104 when no pressure is applied. Thus, when no PR bottle is placed in the container, lower collision-preventing portion 104 may be easier to move in and out of the container. Also, in some embodiments, little or no relative movement occurs between lower collision-preventing portion 104 and position lock-in pins so that both parts are less susceptible to abrasion and maintenance. By fixing the position of lower collision-preventing portion 104, the movement/sway of the PR bottle can be reduced. In some embodiments, the movement/sway of the PR bottle can be in a range of about 3 μm.

Figure 5:
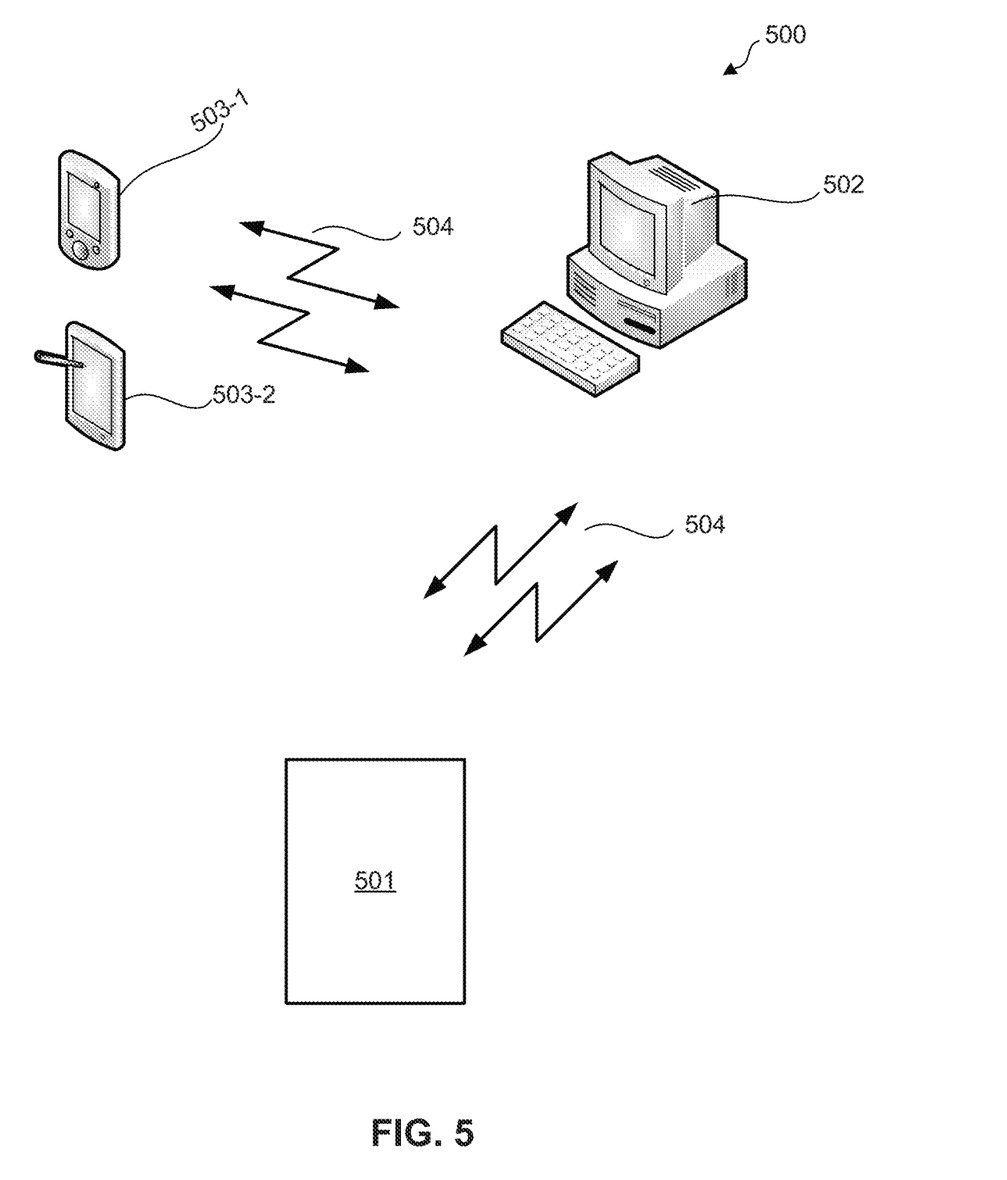
FIG. 5 illustrates an exemplary system, according to some embodiments.

The present disclosure also provides a system for using the container for PR bottle replacement/refill. FIG. 5 illustrates an exemplary system 500 provided by the present disclosure, according to some embodiments. System 500 can include the container 501, a central controller 502, and one or more receiving devices 503 (e.g., 503-1 and 503-2). Container 501 can be the same as or similar to the container illustrated in FIGS. 1A-1C. Container 501 can include suitable software and hardware to detect the placement and any leakage of the PR bottle and transmit (e.g., real-time) updates of the status of the container 501/PR bottle (e.g., detailed information such as the ID number and the location and time of spill/leakage) to central controller 502. For example, container 501 can include an indoor positioning system that can locate the position of container 501 and send (e.g., real-time) location of container 501 to central controller 502. Container 501 can also transmit (e.g., real-time) indicator signals (e.g., flashing light) to indicate the status of the PR bottle. The communication between container 501 and central controller 502 can be obtained through any suitable wired/wireless communication network 504, e.g., WiFi. Central controller 502 can then process the received signals/messages and transmit notifications to receiving devices 503 (e.g., held by technicians) to indicate potential issues with the reported container. Receiving devices 503 can include any suitable devices with wireless communication functions. The communication between central controller 502 and receiving devices 503 can be through a same or different communication network. In some embodiments, the communication between central controller 502 and receiving devices 503 is through communication network 504. In some embodiments, receiving devices 503 include cell phones, tablets, and/or other mobile/stationary computing devices. In some embodiments, receiving devices 503 can communicate with central controller 502 to, e.g., update the status of the container 501/PR bottles. In some embodiments, container 501 deactivates the real-time indicator signals and/or stops transmitting real-time updates after the leakage/spill has been addressed (e.g., cleaned up). In some embodiments, central controller 502 sends a deactivation signal to container 501 to deactivate the real-time indicator signals and/or stops the real-time updates. For illustrative purposes, one container 501 is shown in FIG. 5 as an example.

Information of the status of container 501 can be collected through different sensing mechanisms included in container 501 such as the pairing recognition means (e.g., 108) and the liquid-detecting sensor (e.g., 206). The pairing recognition means (e.g., RFID method/device) can allow container 501 to recognize whether a matching/correct PR bottle is placed in container 501 and periodically update this information in central controller 502 and/or when a mismatch of PR bottle is detected. The sensing mechanism (e.g., liquid-detecting sensor) can detect any liquid leakage/spill in container 501 and send detailed information (e.g., ID number, time, and location) of the leakage/spill to central controller 502. The sensing mechanisms can each send out signals that reflect the detection results to the IC of container 501 so that container 501 can process the signals and transmit the detection results to central controller 502.

The IC of container 501 and central controller 502 can each include any suitable hardware and software that can send, receive, and process various signals (e.g., detection results and notifications). In some embodiments, the IC of container 501 and central controller 502 each includes a microprocessor or a computer system.

Figure 6:
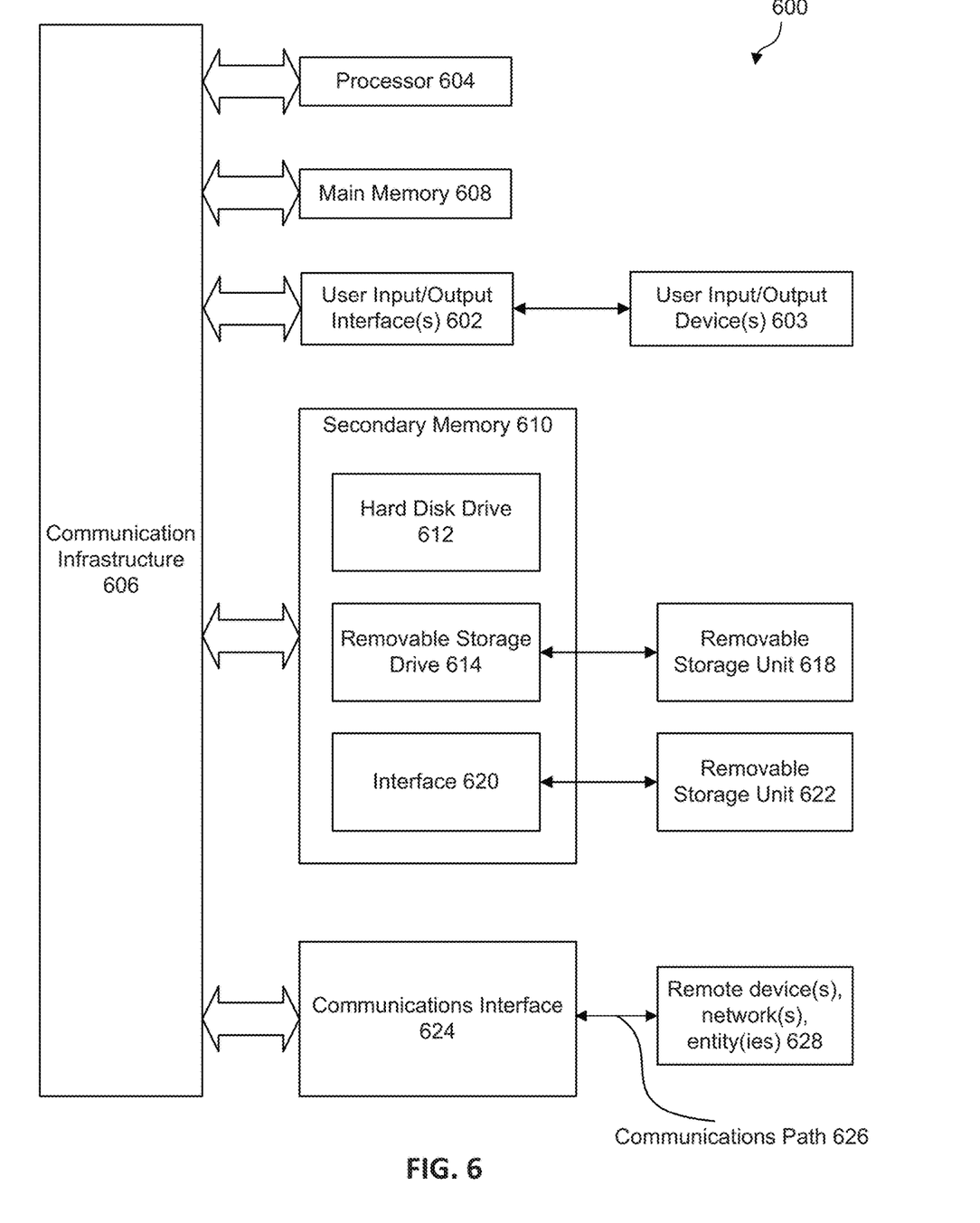
FIG. 6 is an illustration of an example computer system for implementing various embodiments.

FIG. 6 is an illustration of an example computer system 600 in which various embodiments of the present disclosure can be implemented, according to some embodiments. Computer system can be used in the IC of the container and the central controller, as described above. Computer system 600 can be any computer capable of performing the functions and operations described herein. For example, and without limitation, computer system 600 can be capable of processing and transmitting signals. Computer system 600 can be used, for example, to execute one or more functions of the container, which describes example operations of communications amongst different parts of the container and between the container and the central controller.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. Computer system 600 can receive instructions to implement functions and operations described herein—e.g., functions of the container—via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the functions described above with respect to the container.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/any other computer data storage device. Removable storage drive 614 reads from and/or writes to removable storage unit 618 in a well-known manner.

According to some embodiments, secondary memory 610 can include other means, instrumentalities or other approaches for allowing computer programs and/or other instructions and/or data to be accessed by computer system 600. Such means, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the functions described above with respect to the container.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The functions/operations in the preceding embodiments can be implemented in a wide variety of configurations and architectures. Therefore, some or all of the operations in the preceding embodiments—e.g., functions of the container and the central controller—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. In some embodiments, computer system 600 includes hardware/equipment for the manufacturing of photomasks and circuit fabrication. For example, the hardware/equipment can be connected to or be part of element 628 (remote device(s), network(s), entity(ies) 628) of computer system 600.

Embodiments of the present disclosure describe an apparatus and a system for monitoring PR leakage. The disclosed container can hold a PR bottle at an appropriate orientation and prevent potential collision of the PR bottle and PR leakage. The container can provide protection to the PR bottle during usage and transport. The container can enable automated replacement, transport, and recording of the PR bottle. The container can also allow PR leakage to be detected and bi-directional communication with a central controller regarding the status of the container. When PR leakage occurs, the container can communicate with the central controller and/or other devices and transmit detailed information (e.g., the identification (ID) number of the PR bottle/container, location, and time) of the spill/leakage. Thus, PR spill/leakage can be easier to detect.

With the protection of the container, the PR bottle is less susceptible to collision with the sidewalls and other parts of the container. Thus, the PR bottle is less susceptible to PR spill/leakage. Further, the container can verify the correct PR bottle is placed into the container by a suitable pairing recognition means (e.g., radio frequency identification method, Bluetooth method, etc.) so that the PR bottle replacement/refill is less susceptible to human error. The container can further include upper and lower collision-preventing portions that can prevent the PR bottle from being placed at an orientation away from the vertical direction, and a sway-preventing portion that prevents the PR bottle from bouncing and moving in the container. By using the disclosed container and method, PR bottles are less susceptible to damage and PR spill/leakage. The transport and replacement of PR bottles can be less time-consuming and less costly.

Although the container is described in view of preventing PR spill/leakage from a PR bottle, the container can also be used to prevent spill/leakage of other liquid-containing objects (or fluid-containing objects). The shape and dimensions of the container can be adjusted to contain any suitable liquid-containing object (with or without a pairing mechanism with the container) and detect the spill/leakage from the liquid-containing object.

In some embodiments, a container includes a container body and a lid over the container body, a collision-preventing portion attached to one or more of the container body and the lid and configured to buffer an impact force, a pairing recognition mechanism configured to detect an object placed in the container body, and a liquid-detecting sensor configured to detect a leakage from the object.

In some embodiments, a system for monitoring a leakage includes a central controller, a communication network, a container, and a communication means. The communication means can be configured to communicate with the central controller through the communication network. The container can include a container body and a lid over the container body, a collision-preventing portion attached to one or more of the container body and the lid and configured to buffer an impact force, a pairing recognition mechanism configured to detect an object placed within the container body, and a liquid-detecting sensor configured to detect a leakage of the object.

In some embodiments, an apparatus includes a container body and a lid over the container body. The lid can include an upper collision-preventing portion and a bottom of the container body can include a lower collision-preventing portion. The apparatus can also include a liquid-detecting sensor configured to detect a leakage from an object placed in the container body. The apparatus can further include a liquid-collecting hole at a bottom surface of the container body. The liquid-collecting hole can be configured to collect the leakage from the object, and wherein the liquid-detecting sensor is in the liquid-collecting hole.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A container, comprising:
a container body and a lid over the container body, wherein a bottom portion of the container body comprises a pin;
a collision-preventing portion attached to one or more of the container body and the lid and configured to buffer an impact force, wherein the pin protrudes into the collision-preventing portion;
a pairing recognition mechanism configured to detect an object placed in the container body; and
a liquid-detecting sensor configured to detect a leakage from the object.

2. The container of claim 1, wherein the collision-preventing portion comprises an upper collision-preventing portion under the lid and a lower collision-preventing portion over a bottom of the container body.

3. The container of claim 2, further comprising a sway-preventing portion configured to prevent a relative movement between the container body and the lid, wherein a first portion of the sway-preventing portion is attached to the lid, and wherein a second portion of the sway-preventing portion is attached to the container body.

4. The container of claim 2, wherein the lower collision-preventing portion comprises a recessed portion, wherein a top surface of the recessed portion is configured to surround a bottom surface of the object.

5. The container of claim 1, wherein:
the bottom portion of the container body comprises a continuous and angled surface that connects a boundary of the bottom of the container body to a center of the bottom of the container body, wherein; and
an angle between the continuous and angled surface and a horizontal surface is between about 5 degrees and about 45 degrees.

6. The container of claim 5, further comprising a liquid-collecting hole at a center of the bottom of the container body, wherein the liquid-collecting hole is surrounded by the continuous and angled surface, wherein the liquid-collecting hole is configured to collect the leakage from the object, and wherein the liquid-detecting sensor is in the liquid-collecting hole.

7. The container of claim 6, wherein the collision-preventing portion is disposed over the continuous and angled surface, and wherein the collision-preventing portion comprises an opening to expose the liquid-collecting hole.

8. The container of claim 1, wherein the pin comprises a position lock-in pin configured to prevent movement of the collision-preventing portion, wherein the collision-preventing portion comprises a dented portion that covers at least a portion of the position lock-in pin.

9. The container of claim 1, wherein the pin comprises:
a pressure sensor; and
an elastic structure under the pressure sensor, wherein the elastic structure is configured to provide a horizontal deformation in response to a pressure being detected by the pressure sensor.

10. The container of claim 1, wherein pin comprises:
a pin body separated from the collision-preventing portion; and
a pin cap disposed over the pin body and protruding into the collision-preventing portion.

11. A system for monitoring a leakage, comprising:
a central controller;
a communication network;
a container comprising:
a container body and a lid over the container body, wherein a bottom portion of the container body comprises a pin;
a collision-preventing portion attached to one or more of the container body and the lid and configured to buffer an impact force, wherein the pin protrudes into the collision-preventing portion;
a pairing recognition mechanism configured to detect an object placed within the container body; and
a liquid-detecting sensor configured to detect a leakage of the object; and
a communication means configured to communicate with the central controller through the communication network.

12. The system of claim 11, wherein the bottom portion of the container body further comprises:
a liquid-collecting hole; and
an angled surface that connects from a boundary of the bottom of the container body to a center of the bottom of the container body, wherein the angled surface encircles the liquid-collecting hole, and wherein the pin is disposed over the angled surface.

13. The system of claim 12, further comprising a hand-held device configured to communicate with the central controller to receive a real-time status data of a leakage time and a leakage location associated with leakage of the object.

14. The system of claim 11, wherein the collision-preventing portion comprises an upper collision-preventing portion under the lid and a lower collision-preventing portion over a bottom of the container body.

15. The system of claim 14, wherein the lower collision-preventing portion comprises a dented portion that covers at least a portion of the pin.

16. The system of claim 11, wherein a first portion of a bottom surface of the collision-preventing portion comprises an indented portion over the pin, and wherein the liquid-detecting sensor disposed under an opening of a second portion of the bottom surface of the collision-preventing portion.

17. An apparatus, comprising:
- a container body and a lid over the container body, wherein the lid comprises an upper collision-preventing portion, and wherein a bottom portion of the container body comprises a lower collision-preventing portion and a plurality of pins protruding into the lower collision-preventing portion;
- a liquid-detecting sensor configured to detect a leakage from an object placed in the container body; and
- a liquid-collecting hole at a bottom surface of the container body, wherein the liquid-collecting hole is configured to collect the leakage from the object, and wherein the liquid-detecting sensor is in the liquid-collecting hole.

18. The apparatus of claim 17, wherein the plurality of pins comprise a plurality of position lock-in pins configured to prevent movement of the upper and lower collision-preventing portions.

19. The apparatus of claim 18, further comprises a sensing mechanism configured to detect an identity of the object.

20. The apparatus of claim 17, wherein a lateral separation between the liquid-collecting hole and a pin of the plurality of pins is substantially equal to an other lateral separation between the liquid-collecting hole and an other pin of the plurality of pins.

* * * * *